US009312865B2

(12) United States Patent
Song et al.

(10) Patent No.: US 9,312,865 B2
(45) Date of Patent: Apr. 12, 2016

(54) BIMODAL SERIAL LINK CDR ARCHITECTURE

(71) Applicant: SAMSUNG DISPLAY CO., LTD., Yongin, Gyeonggi-Do (KR)

(72) Inventors: Sanquan Song, San Jose, CA (US); Amir Amirkhany, Sunnyvale, CA (US)

(73) Assignee: Samsung Display Co., Ltd., Yongin (KR)

( * ) Notice: Subject to any disclaimer, the term of this patent is extended or adjusted under 35 U.S.C. 154(b) by 0 days.

(21) Appl. No.: 14/550,776

(22) Filed: Nov. 21, 2014

(65) Prior Publication Data

US 2015/0162922 A1     Jun. 11, 2015

Related U.S. Application Data

(63) Continuation of application No. 61/912,480, filed on Dec. 5, 2013.

(51) Int. Cl.
| | |
|---|---|
| *H03D 3/24* | (2006.01) |
| *H03L 7/08* | (2006.01) |
| *H03L 7/07* | (2006.01) |
| *H04L 7/033* | (2006.01) |
| *H03L 7/087* | (2006.01) |

(Continued)

(52) U.S. Cl.
CPC ............... *H03L 7/0807* (2013.01); *H03L 7/07* (2013.01); *H03L 7/087* (2013.01); *H03L 7/0891* (2013.01); *H03L 7/091* (2013.01); *H03L 7/145* (2013.01); *H04L 7/0025* (2013.01); *H04L 7/0091* (2013.01); *H04L 7/033* (2013.01);

(Continued)

(58) Field of Classification Search
CPC ...... H04L 7/033; H04L 7/0331; H04L 7/0091; H04L 7/0025; H04L 7/0008; H03L 7/0807; H03L 7/0891; H03L 7/087; H03L 7/145; H03L 7/091; H03L 7/07; G09G 5/008
USPC ........................................................ 375/376
See application file for complete search history.

(56) References Cited

U.S. PATENT DOCUMENTS

| | | | |
|---|---|---|---|
| 7,099,424 B1 | 8/2006 | Chang et al. | |
| 7,715,467 B1 | 5/2010 | Burney | |

(Continued)

FOREIGN PATENT DOCUMENTS

| | | |
|---|---|---|
| KR | 10-2006-0013206 A | 2/2006 |
| KR | 10-2011-0073341 A | 6/2011 |
| WO | WO 2013/137863 A1 | 9/2013 |

OTHER PUBLICATIONS

EPO Search Report dated Apr. 13, 2015, for corresponding European Patent application 14195592.2, (9 pages).

(Continued)

*Primary Examiner* — Tanmay Shah
(74) *Attorney, Agent, or Firm* — Lewis Roca Rothgerber Christie LLP

(57) ABSTRACT

A system for generating a local clock, configurable to utilize a forwarded clock and a data stream, or a data stream only, as frequency and phase references. In one embodiment, the system includes a phase locked loop that may be referenced to a forwarded clock, or to a phase reference formed from received data, utilizing a sampler, a crossing sampler, and a bang-bang phase detector. The system includes a local phase recovery loop which may utilize the bang-bang phase detector as part of a phase detector for controlling a phase interpolator, the output of the phase interpolator serving as the local clock for clocking received data.

8 Claims, 5 Drawing Sheets

(51) Int. Cl.
  *H03L 7/089* (2006.01)
  *H03L 7/091* (2006.01)
  *H03L 7/14* (2006.01)
  *G09G 5/00* (2006.01)
  *H04L 7/00* (2006.01)

(52) U.S. Cl.
  CPC ............ *H04L 7/0331* (2013.01); *G09G 5/008* (2013.01); *H04L 7/0008* (2013.01)

(56) References Cited

U.S. PATENT DOCUMENTS

| | | | |
|---|---|---|---|
| 2004/0170244 A1 | 9/2004 | Cranford, Jr. et al. | |
| 2006/0256909 A1* | 11/2006 | On | H03D 13/004 375/376 |
| 2008/0285694 A1* | 11/2008 | Lee | 375/355 |
| 2010/0315142 A1 | 12/2010 | Zerbe | |
| 2011/0025913 A1 | 2/2011 | Sugiyama | |
| 2012/0033773 A1* | 2/2012 | Nedovic | H03L 7/0807 375/371 |
| 2013/0294490 A1 | 11/2013 | Chandrasekaran et al. | |
| 2014/0139266 A1* | 5/2014 | Kenney | G01R 25/005 327/9 |
| 2015/0078495 A1* | 3/2015 | Hossain et al. | 375/346 |

OTHER PUBLICATIONS

Savoj, B., et al., *Clock and Data Recovery Architectures*, High-Speed CMOS Circuits for Optical Receivers, Jan. 1, 2001, 58 pages, XP-002306705.

* cited by examiner

BIMODAL SERIAL LINK CDR ARCHITECTURE

CROSS-REFERENCE TO RELATED APPLICATION(S)

The present application claims priority to and the benefit of Provisional Application No. 61/912,480, filed Dec. 5, 2013, entitled "BIMODAL SERIAL LINK CDR ARCHITECTURE", the entire content of which is incorporated herein by reference.

FIELD

One or more aspects of embodiments according to the present invention relate to systems for transmitting digital data between circuits, and more particularly to circuits for generating a local clock from a data stream or from a forwarded clock in such systems.

BACKGROUND

When data are sent over an extended high-speed serial link, a receiver at the receiving end of the link may be utilized to restore signal levels from the received signal, which may be attenuated by the link, and to re-synchronize the data with a local clock. The local clock may be formed from the data stream itself, transmitted on one or more data lanes as an embedded clock, or it may be formed from a forwarded clock transmitted on a separate clock lane. The local clock may or may not be a full rate clock, e.g., it may be a half-rate clock. The forwarded clock may have a frequency lower than that of the local clock. The selection of the scheme for transmitting a clock signal to the receiver, whether as an embedded clock or as a forwarded clock, is influenced by various factors such as the length of the link, the data rate to be utilized, or the number of available physical lanes. A designer designing multiple products may therefore require that two versions of a receiving circuit be available, one which is compatible with an embedded clock scheme and one which is compatible with a forwarded clock. This requirement is inconvenient and adds cost to supply and manufacturing operations, which may be required to stock two versions of otherwise similar or identical parts.

Thus, there is a need for a bimodal circuit capable of generating a local clock from either a forwarded clock or an embedded clock.

SUMMARY

Aspects of embodiments of the present disclosure are directed toward a system for generating a local clock, configurable to utilize a forwarded clock and a data stream (in a forwarded clock mode), or a data stream only (in an embedded clock mode), as frequency and phase references. In one embodiment, the system includes a phase locked loop that may be referenced to a forwarded clock, or to a phase reference formed from received data, utilizing a sampler, a crossing sampler, and a bang-bang phase detector. The system includes a local phase recovery loop which may utilize the bang-bang phase detector as part of a phase detector for controlling a phase interpolator, the output of the phase interpolator serving as the local clock for clocking received data.

According to an embodiment of the present invention, there is provided a system for generating a local clock, the system including: a controlled oscillator having an input and an output; a first link data input; a forwarded clock input; and a first phase detector having a first input, a second input, and an output; and a first phase recovery block having a clock input, a data input connected to the first link data input, and an output switch-connected to the input of the controlled oscillator; the first input of the first phase detector being connected to the output of the controlled oscillator, the second input of the first phase detector being connected to the forwarded clock input, and the output of the first phase detector being switch-connected to the controlled oscillator.

In one embodiment, the system includes a charge pump and an analog loop filter, the charge pump and the analog loop filter connected in cascade between the output of the first phase detector and the input of the controlled oscillator.

In one embodiment, the system includes a first phase interpolator having: an oscillator input; a phase adjust input; and an output; the oscillator input of the first phase interpolator being connected to the output of the controlled oscillator and the output of the first phase interpolator being connected to the clock input of the first phase recovery block.

In one embodiment, the system includes: a second link data input; a second phase recovery block having a clock input, a data input, and an output, the data input of the second phase recovery block being connected to the second link data input; a second phase interpolator having an oscillator input, a phase adjust input, and an output; the output of the second phase recovery block being connected to the phase adjust input of the second phase interpolator, the oscillator input of the second phase interpolator being connected to the output of the controlled oscillator, and the output of the second phase interpolator being connected to the clock input of the second phase recovery block.

In one embodiment, the system includes a divider having an input and an output, the input of the divider connected to an output of the controlled oscillator and the output of the divider being connected to the first input of the first phase detector.

In one embodiment, the system includes a circuit to generate an analog output signal proportional to the difference in phase between a signal at the first input of the first phase detector and a signal at the second input of the first phase detector.

In one embodiment, the first phase interpolator includes: a circuit to generate, at the output of the first phase interpolator, a signal differing in phase from a signal at the oscillator input of the first phase interpolator, by an amount corresponding to a signal at the phase adjust input of the first phase interpolator.

In one embodiment, the system includes a digital loop filter including: an input; an output; and a circuit to receive, at the input of the digital loop filter, a digital input signal, and to generate, at the output of the loop filter, a digital output signal.

In one embodiment, the system includes: a data input, a clock input, and an output; and a bang-bang phase detector including a first input, a second input, and an output.

In one embodiment, the clock input of the first sampler and the clock input of the second sampler are connected to the clock input of the first phase recovery block; the data input of the first sampler and the data input of the second sampler are connected to the data input of the first phase recovery block; the output of the first sampler is connected to the first input of the bang-bang phase detector; the output of the second sampler is connected to the second input of the bang-bang phase detector; and the output of the bang-bang phase detector is connected to the output of the first phase recovery block.

In one embodiment, the system includes a control logic circuit to select between a first mode of operation and a tracking phase of a second mode of operation, wherein in the first mode of operation, the output of the first phase detector is connected, with an enabled connection, to the input of the controlled oscillator, and in the tracking phase of the second mode of operation, the output of the first phase recovery block is connected, with an enabled connection, to the input of the controlled oscillator.

In one embodiment, in the first mode of operation, the output of the first phase recovery block is connected, with an enabled connection, to the phase adjust input of the first phase interpolator.

In one embodiment, the control logic circuit further is a circuit to select between the first mode of operation, the tracking phase of the second mode of operation, and a training phase of the second mode of operation, wherein, in the training phase of the second mode of operation, the output of the first phase detector is connected, with an enabled connection, to the input of the controlled oscillator, and the first link data input is connected, with an enabled connection, to the forwarded clock input.

In one embodiment, the system includes a transmitter, the transmitter including a circuit to, in the training phase of the second mode of operation, transmit a pattern of alternating groups of ones and zeros.

In one embodiment, the system includes: a data buffer including an output and a differential input, the differential input including a first conductor and second conductor; a forwarded clock buffer including an output and a differential input, the differential input including a first conductor and second conductor; wherein the control logic circuit further is a circuit to select between the first mode of operation, the tracking phase of the second mode of operation, and a training phase of the second mode of operation wherein, in the training phase of the second mode of operation, the output of the first phase detector is connected, with an enabled connection, to the input of the controlled oscillator; the first conductor of the differential input of the data buffer is connected, with an enabled connection, to the first conductor of the differential input of the forwarded clock buffer; and the second conductor of the differential input of the data buffer is connected, with an enabled connection, to the second conductor of the differential input of the forwarded clock buffer.

In one embodiment, a display includes: a timing controller; a driver integrated circuit (IC); and a serial data link connecting the timing controller and the driver IC, the driver IC including a system for generating a local clock.

In one embodiment, the display is an organic light emitting diode (OLED) display or a liquid crystal display (LCD).

BRIEF DESCRIPTION OF THE DRAWINGS

These and other features and advantages of the present invention will be appreciated and understood with reference to the specification, claims, and appended drawings wherein:

DETAILED DESCRIPTION

Figure 1:
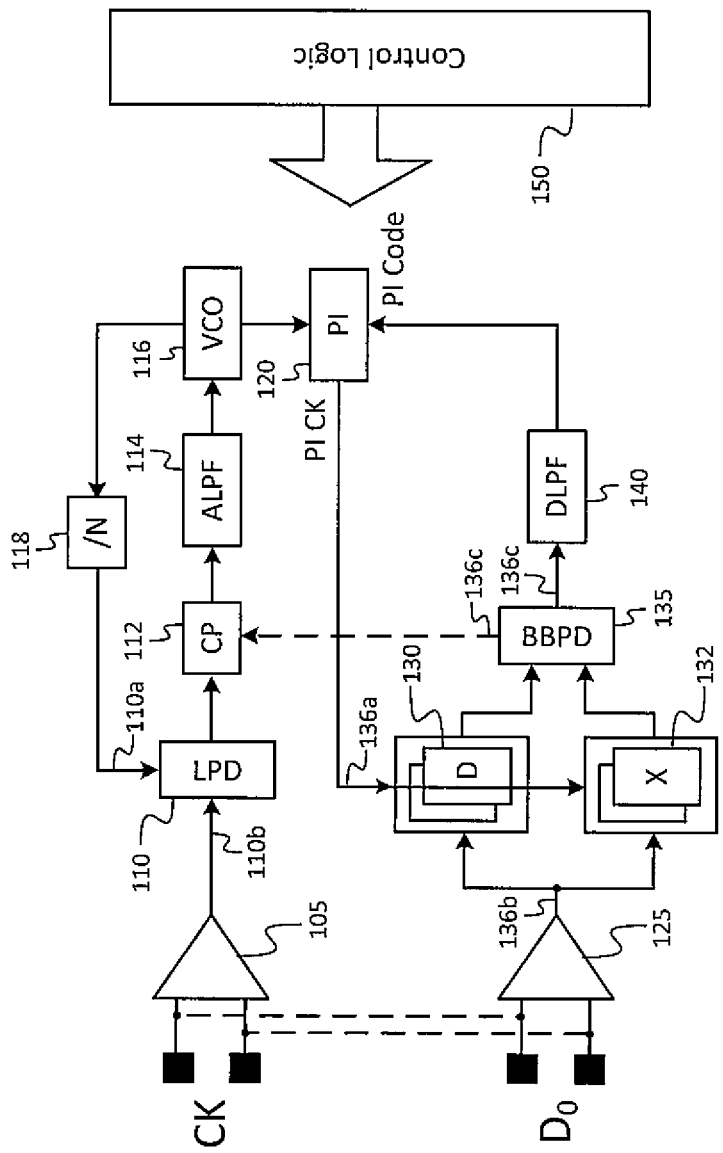
FIG. 1 is a block diagram of a clock and data recovery circuit in a forwarded clock (FC) mode of operation according to an embodiment of the present invention.

The detailed description set forth below in connection with the appended drawings is intended as a description of exemplary embodiments of a bimodal serial link CDR architecture provided in accordance with the present invention and is not intended to represent the only forms in which the present invention may be constructed or utilized. The description sets forth the features of the present invention in connection with the illustrated embodiments. It is to be understood, however, that the same or equivalent functions and structures may be accomplished by different embodiments that are also intended to be encompassed within the spirit and scope of the invention. As denoted elsewhere herein, like element numbers are intended to indicate like elements or features.

Expressions such as "at least one of", when preceding a list of elements, modify the entire list of elements and do not modify the individual elements of the list. It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section, without departing from the spirit and scope of the inventive concept.

Spatially relative terms, such as "beneath", "below", "lower", "under", "above", "upper" and the like, may be used herein for ease of description to describe one element or feature's relationship to another element(s) or feature(s) as illustrated in the figures. It will be understood that such spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising", when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Further, the use of "may" when describing embodiments of the inventive concept refers to "one or more embodiments of present invention". Also, the term "exemplary" is intended to refer to an example or illustration.

It will be understood that when an element or layer is referred to as being "on", "connected to", "coupled to", or "adjacent to" another element or layer, it may be directly on, connected to, coupled to, or adjacent to the other element or layer, or one or more intervening elements or layers may be present. In contrast, when an element or layer is referred to as being "directly on", "directly connected to", "directly coupled to", or "immediately adjacent to" another element or layer, there are no intervening elements or layers present.

When an element is referred to as being "switch-connected" to another element, it is connected to the other element with at least one intervening element, e.g., a switching element, such as a transistor or a switch, that may be set either to enable or to disable the connection. When two elements are switch-connected, the connection between the two elements may be referred to as a "switchable connection", which when enabled is an "enabled connection" and when disabled is a "disabled connection".

As will be understood by one of skill in the art, an input or output of a component may be a single conductor carrying a signal represented as a voltage with respect to ground, or it may be a differential input or output including a pair of conductors carrying complementary signals. A connection shown in the drawings as a single line may represent more than one conductor, carrying, for example, a differential signal composed of a signal and its complement.

Referring to FIG. 1, in one embodiment a bimodal serial link clock and data recovery (CDR) circuit operates in a forwarded clock mode (or "first mode") when configured as shown. A forwarded clock is received at a forwarded clock buffer 105, and the output of the forwarded clock buffer 105 is fed to the cascade of a first phase detector, which may be a linear phase detector (LPD) or "first phase detector" 110, a charge pump (CP) 112, an analog loop filter (ALPF) 114, and a voltage-controlled oscillator (VCO) 116. The linear phase detector 110 has an output and two inputs, a first input 110a and a second input 110b, the second input 110b being (or being connected to) an input (or "forwarded clock input") for receiving a forwarded clock from the link. The output of the voltage-controlled oscillator 116 is fed back through a divider 118 to the first input of the linear phase detector 110, and the output of the forwarded clock buffer 105 is connected to the second input of the linear phase detector 110. The divider 118 has an input and an output, and divides the frequency of the voltage-controlled oscillator 116 by an integer N, so that when the voltage-controlled oscillator 116 is operating at N times the frequency of the forwarded clock, the two inputs of the linear phase detector 110 receive signals with the same frequency. The input of the divider 118 is connected to an output of the voltage-controlled oscillator 116 and the output of the divider 118 is connected to the first input of the first phase detector 110.

In one embodiment, the charge pump 112 sources or sinks a current proportional to the output of the linear phase detector 110, and at the input of the analog loop filter 114 there is a capacitor or an RC network (such as the filter of a $2^{nd}$ order phase-locked loop (PLL)), the rate of change of voltage on which is then proportional to the current sourced or sunk by the charge pump. The combination of linear phase detector 110, the charge pump 112, the analog loop filter 114, and the voltage-controlled oscillator 116 connected in a loop forms a phase-locked loop (PLL). The linear phase detector 110 includes a circuit that generates an analog output signal proportional to the difference in phase between the signals at its two inputs; this signal is amplified and filtered by the cascade of the charge pump 112 and the analog loop filter 114, which together provide suitable gain and a suitable loop shape so that the performance and stability of the PLL are acceptable. In one embodiment, the charge pump 112 and the analog loop filter 114 are connected in cascade between the output of the first phase detector 110 and the input of the voltage-controlled oscillator 116.

The output of the voltage-controlled oscillator 116 is then utilized as a reference clock, the phase of which is adjusted by a phase interpolator (PI) 120 controlled by a local phase recovery loop. The phase interpolator 120 has an oscillator input and a phase interpolation code (PI Code) or "phase adjust" input, and it generates an output that is formed by phase-shifting the reference clock by an amount corresponding to the phase interpolation code received at the phase interpolation code input. In one embodiment, the phase interpolator 120 has an oscillator input including several conductors for receiving several phases of the local clock from the VCO 116, and it generates the output as a linear combination of the several phases. In another embodiment the phase interpolator 120 includes one or more delay elements the output of each of which is the reference clock signal with a phase shift; the phase interpolator 120 then generates a local clock, at an arbitrary phase of the reference clock, as a linear combination of the outputs of the delay elements. Embodiments described herein employ a voltage-controlled oscillator, but a digitally controlled oscillator, or any oscillator having a controllable frequency (referred to herein as a "controlled oscillator"), may be employed. As used herein, a "clock signal", a "clock input", a "clock output", an "oscillator input", and a "VCO output" may refer to one conductor carrying a voltage or current at the clock frequency, or it may refer to multiple conductors carrying the clock frequency with different phases, or using differential signaling, or both. In one embodiment, the oscillator input of the phase interpolator 120 is connected to the output of the controlled oscillator (e.g., VCO 116) and the output of the phase interpolator 120 is connected to the clock input of the phase recovery block (130, 132, 135). In one embodiment, in the first mode of operation, the output of the first phase recovery block (130, 132, 135) is connected, with an enabled connection, to the phase adjust input of the first phase interpolator 120.

A data signal on a first data lane $D_0$ is buffered by a data buffer 125, and the buffered signal is fed to a data sampler (or "first sampler") 130 and a crossing sampler (or "second sampler") 132, each of the first sampler and the second sampler having a data input, a clock input, and an output. Each of the data buffer 125 and the forwarded clock buffer 105 may have a differential input, e.g., an input having two conductors carrying complementary signals, and a differential or single-ended output. In one embodiment, the data buffer 125 and the forwarded clock buffer 105 are absent, and the system for generating the local clock, i.e., the CDR circuit, has, as inputs, the input of the linear phase detector 110 and the connected inputs of the two samplers 130, 132. The data sampler 130 samples the output of the data buffer 125 on transitions of the local clock, and the crossing sampler 132 samples the output of the data buffer 125 on transitions of a quadrature clock, which is a signal derived from the local clock, phase shifted by one half of a bit period. The quadrature clock may be provided as part of a clock signal generated by the phase interpolator 120 (the phase of the local clock and of the quadrature clock signals at the output of the phase interpolator both being adjusted according to the signal at the phase adjust input of the phase interpolator), or it may be generated by a separate quadrature clock generator outside the phase interpolator 120. The outputs of the data sampler and the crossing sampler are fed to a bang-bang phase detector (BBPD) 135 (having a first input, a second input, and an output), the output of which is fed to a digital loop filter (DLPF) 140, which in turn generates a phase interpolation code that is then fed to the phase interpolation code input of the phase interpolator 120 to correct, if necessary, the phase of the local clock. The two samplers 130, 132, the hang-bang phase detector 135, the digital loop filter 140, and the phase interpolator 120 form a local phase recovery loop. In operation the output of the bang-bang phase detector 135 is a digital signal indicating whether the quadrature clock leads or lags crossings in the output of the data buffer 125, for example by taking the values of zero or one, respectively, when the quadrature clock leads or lags crossings in the output of the data buffer 125. The combination of the two samplers 130, 132, the quadrature clock generator (if present), and the bang-bang phase detector 135 form a phase recovery block having: a clock input 136a receiving a signal from the phase interpolator 120, a data input 136b connected to the output of the data buffer 125 (the data input 136b being (or being connected to) an input (or "link data input") for receiving data from the link), and an output 136c, which is the output of the bang-bang phase detector 135. This phase recovery block measures, with 1-bit resolution, the phase of the local clock relative to the output of the data buffer 125. The digital loop filter 140 has an input and an output and a circuit to receive, at the input of the digital loop filter 140, a digital input signal, and to generate, at the output of the loop filter 140, a digital output signal. It provides gain and a suitable loop shape so that the performance and stability of the local phase recovery loop are acceptable. As used herein, a "phase recovery block" is any circuit that compares a data stream to a clock signal and generates an output the value of which indicates whether the clock signal leads or lags a phase defined by transitions in the data stream. In this embodiment the output of the phase recovery block (130, 132, 135) is switch-connected (with a disabled connection) to the voltage-controlled oscillator 116. Moreover, the first input of the first phase detector 110 is connected to the output of the controlled oscillator, the second input of the first phase detector 110 is connected to the forwarded clock input, and the output of the first phase detector 110 is switch-connected to the controlled oscillator (e.g., VCO 116). Some of these connections are through intervening elements, as shown in FIG. 1.

Other data lanes, which may be referred to as $D_1$, $D_2$, etc., may share the local clock; each such data lane may have a respective data buffer and a respective data sampler. Each data lane may have a respective local phase recovery loop, each phase recovery loop including a data sampler, a crossing sampler, a bang-bang phase detector, a digital loop filter, and a phase interpolator. In this embodiment, the forwarded clock acts as a frequency reference for the VCO, and each received data stream acts as its own phase reference.

Figure 3:
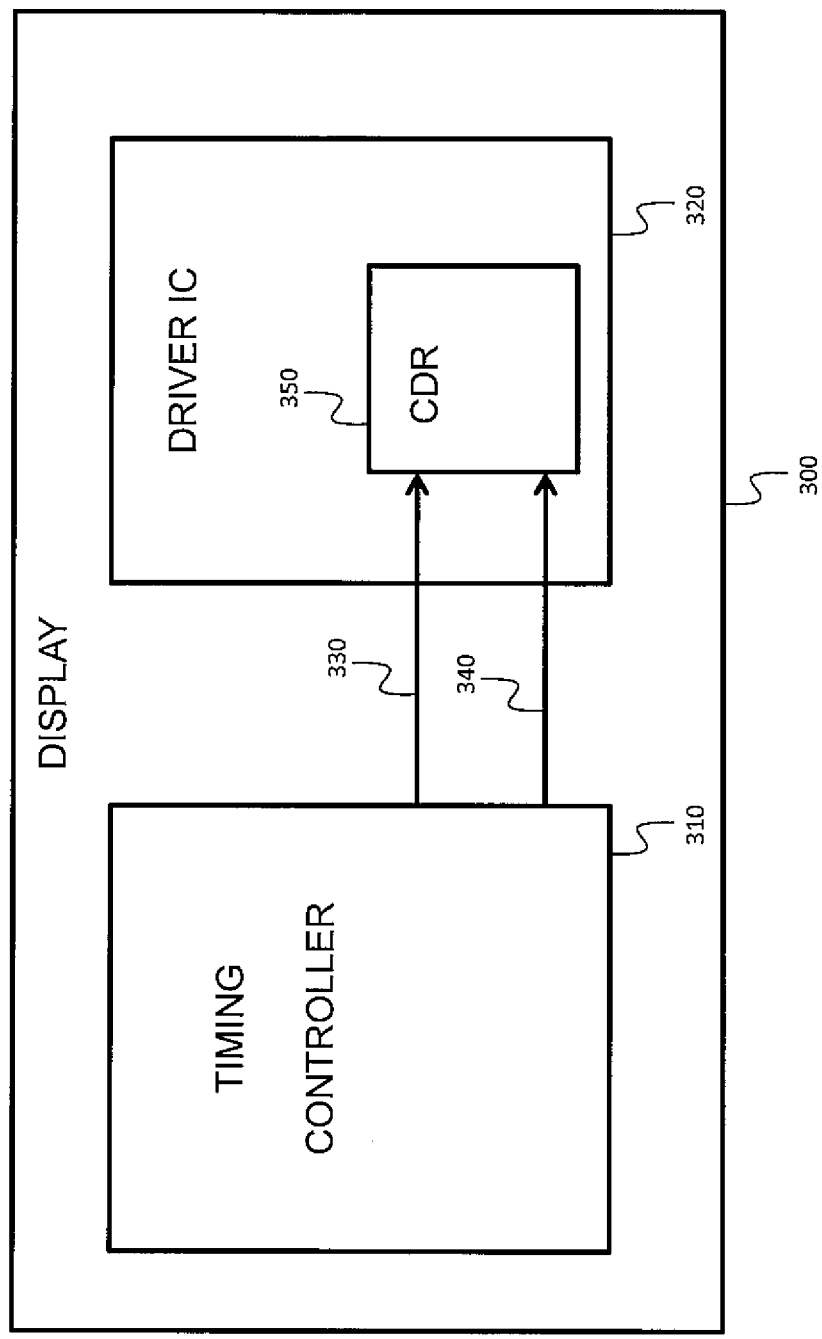
FIG. 3 is a block diagram of a display including a serial link, between two circuits of the display, employing an embodiment of the present invention.
Figure 4:
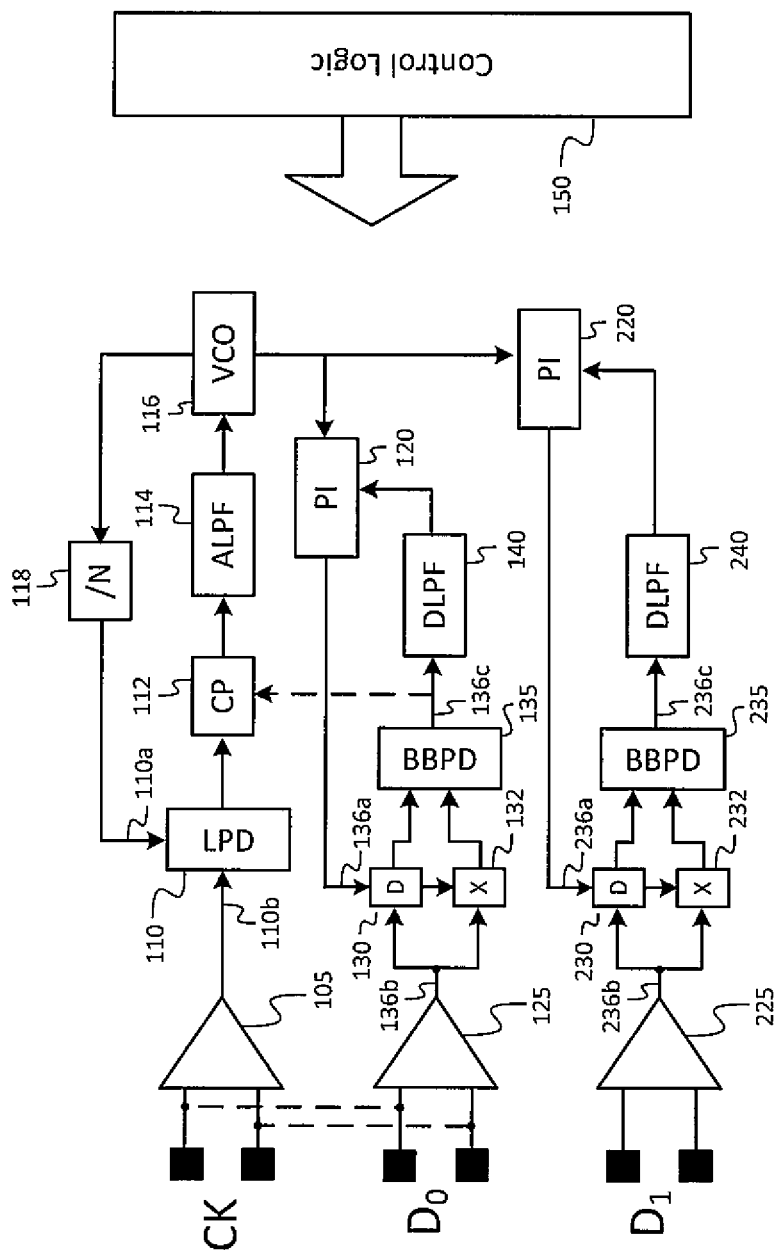
FIG. 4 is a block diagram of a clock and data recovery circuit with two data lanes in a forwarded clock (FC) mode of operation, employing an embodiment of the present invention.

For example, referring to FIG. 4, in such an embodiment, the system may include a controlled oscillator (e.g., VCO 116) having an input and an output; a first link data input (e.g., 136b); a forwarded clock input (e.g., 110b); and a first phase detector 110 having a first input, a second input, and an output; and a first phase recovery block (e.g., formed by a first data sampler 130, a first crossing sampler 132, and a first bang-bang phase detector 135) having a clock input 136a, a data input 136b connected to the first link data input, and an output switch-connected to the input of the controlled oscillator (e.g., VCO 116); the first input of the first phase detector 110 connected to the output of the controlled oscillator (e.g., VCO 116), the second input 110b of the first phase detector 110 connected to the forwarded clock input (e.g., 110b), and the output of the first phase detector 110 being switch-connected to the controlled oscillator (e.g., VCO 116), and a second link data input (e.g., 236b); a second phase recovery block having a clock input 236a, a data input 236b, and an output, the data input 236b of the second phase recovery block (including a second data sampler 230, a second crossing sampler 232, and a second bang-bang phase detector 235) being connected to the second link data input (e.g., 236b); a second phase interpolator 220 having an oscillator input, a phase adjust input; and an output; the output of the second phase recovery block (230, 232, 235) being connected to the phase adjust input of the second phase interpolator 220, the oscillator input of the second phase interpolator 220 being connected to the output of the controlled oscillator, and the output of the second phase interpolator 220 being connected to the clock input of the second phase recovery block (230, 232, 235). In FIGS. 1-3 the possible existence of additional data lanes is shown by rectangles behind, and offset from, the data sampler (or first data sampler) 130 and the crossing sampler (or first crossing sampler) 132 for the first data link $D_0$; in FIG. 4 the components for a second data link $D_1$ are shown explicitly.

Connections between the data buffer 125 and the forwarded clock buffer 105, and a connection between the bang-bang phase detector 135 and the charge pump 112, which are shown as dashed lines in FIG. 1, are disabled, under the control of control logic 150, when the circuit is operating in forwarded clock mode. In one embodiment each of these connections, which may be enabled or disabled by the control logic 150, includes one or more metal oxide semiconductor field effect transistors (MOSFETs) which may be turned on (e.g., made conducting) or turned off by the application of suitable gate voltages from the control logic circuit 150.

Figure 2A:
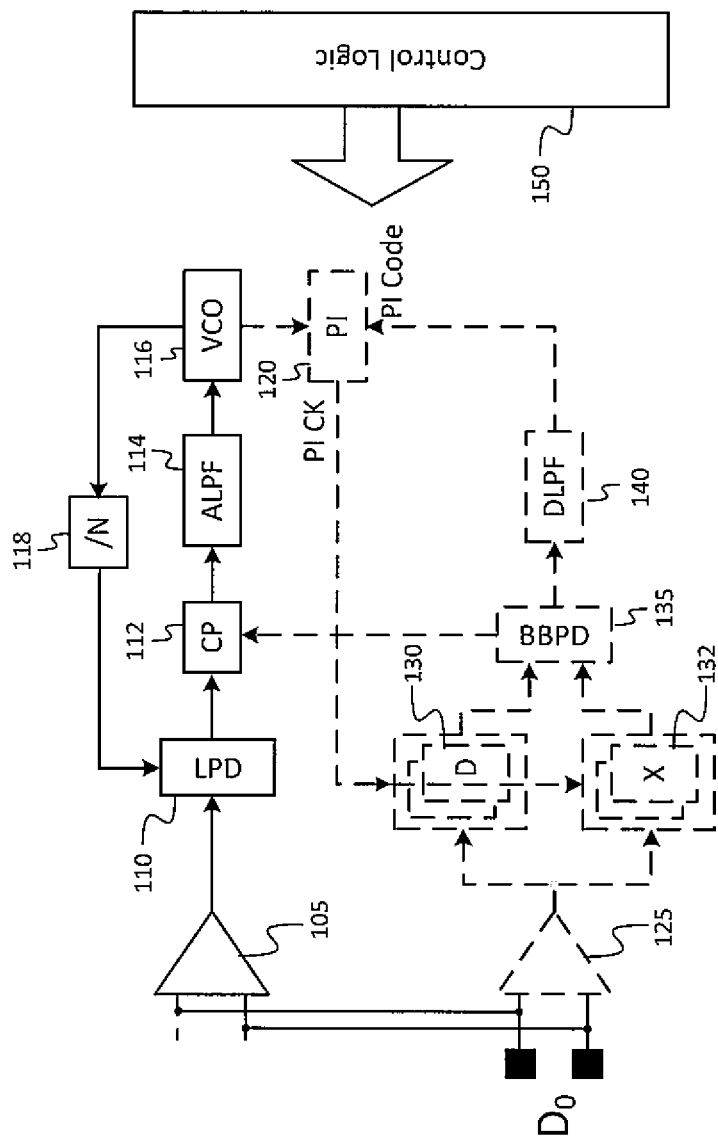
FIG. 2A is a block diagram of a clock and data recovery circuit in an embedded clock (EC) mode of operation during a training phase according to an embodiment of the present invention.

Referring to FIG. 2A, in one embodiment, the circuit of FIG. 1 may be reconfigured to act as a clock and data recovery circuit for an embedded clock, operating, as configured in FIG. 2A, in a second (embedded clock) mode, in a training phase. Under the control of the control logic 150, the connections between the link data input for data lane $D_0$ and the clock input are enabled, and the data buffer 125, and the local phase recovery loop, are disabled, including the data sampler 130, the crossing sampler 132, the bang-bang phase detector 135, the digital loop filter 140, and the phase interpolator 120. The disabled elements may be disabled individually or as a functional block, for example, by having their inputs or outputs disconnected as a result of MOSFETs which otherwise would establish those connections being turned off under the control of the control logic 150.

In the training phase of the embedded clock CDR circuit illustrated in FIG. 2A, the transmitter sending data on the data lane $D_0$ transmits a suitable bit pattern, e.g., alternating ones and zeros or a similar, lower-frequency pattern such as groups of alternating ones and zeros, e.g., "00110011" or "0000111100001111". The divider 118 is set to a ratio N corresponding to the bit pattern. In this training phase, the phase locked loop acquires lock, i.e., the voltage-controlled oscillator 116 frequency is adjusted to the correct frequency, from an initial (e.g., free-running) frequency that may differ by a few hundred parts per million, or a few thousand parts per million or more, from the frequency corresponding to the data rate received. This adjustment occurs through the action of the phase locked loop, e.g., if the phase at the output of the divider 118 lags the phase of the received bit pattern, the linear phase detector 110 will detect the phase lag, and the charge pump 112 and the analog loop filter 114 will increase the frequency of the voltage-controlled oscillator 116, until at steady state the phase at the output of the divider 118 is substantially the same, and remains substantially the same, as the phase of the received bit pattern, and the frequency at the output of the divider 118 is substantially the same as the frequency of the received bit pattern.

Figure 2B:
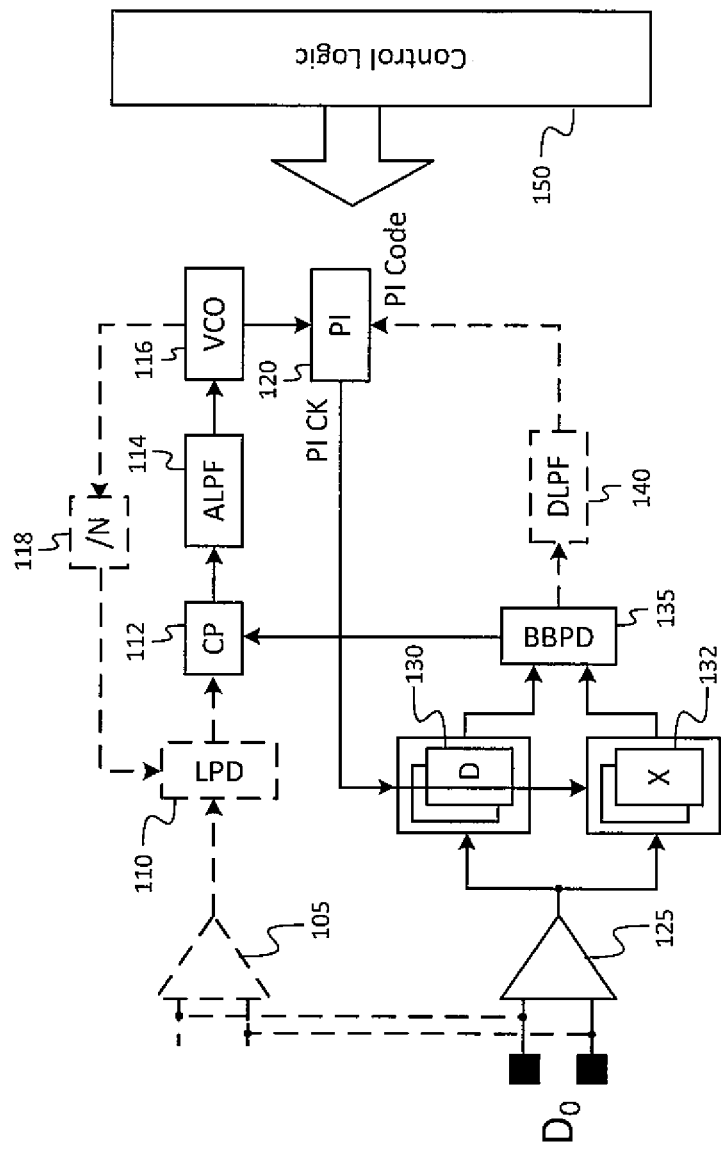
FIG. 2B is a block diagram of a clock and data recovery circuit in the EC mode of operation during a normal working phase, or "tracking phase" according to an embodiment of the present invention.

In one embodiment, once the training phase is complete and the voltage-controlled oscillator 116 is operating at the correct frequency, the control logic 150 changes the configuration of the circuit to a tracking phase of the second (embedded clock) mode of operation, shown in FIG. 2B. This involves enabling any otherwise disabled connections to and from the data buffer 125, the data sampler 130, the crossing sampler 132, and the bang-bang phase detector 135, and the connection between the bang-bang phase detector 135 and the charge pump 112. It also involves disabling the divider 118, the linear phase detector 110, the forwarded clock buffer 105, and the digital loop filter 140. In this configuration, the data stream received on the data lane $D_0$ is in general not a periodic bit pattern of alternating groups of ones and zeros but an arbitrary data stream transmitted by the transmitter. As in the configuration of FIG. 1, the bang-bang phase detector 135 generates a signal indicating whether the quadrature clock leads or lags crossings in the output of the data buffer 125. In the configuration of FIG. 2B, the output of the bang-bang phase detector 135 feeds the charge pump, which feeds the analog loop filter 114 to correct the frequency of the voltage-controlled oscillator 116, locking the phase of the voltage-controlled oscillator 116 to that of the data. In a configuration in which an embedded clock is recovered, as in the embodiment illustrated in FIG. 2B, the control logic 150 may also, in addition to enabling certain elements and disabling others, set parameters in the charge pump 112 and in the analog loop filter 114 to provide a loop shape and gain for the phase locked loop that provides acceptable performance and robustness. Thus, in the second phase of the embedded clock mode, one data lane, referred to as data lane $D_0$ (which may be any of the data lanes) controls the frequency of the VCO. Other data lanes receive the output of the VCO and each of the other data lanes ($D_1$, $D_2$, etc.) has a respective local phase recovery loop, each phase recovery loop including two samplers 130, 132, a bang-bang phase detector 135, a digital loop filter 140, and a phase interpolator 120. In one embodiment, in the tracking phase of the second mode of operation, the output of the first phase recovery block (e.g., formed by a first data sampler 130, a first crossing sampler 132, and a first bang-bang phase detector 135) is connected, with an enabled connection, to the input of the controlled oscillator (e.g., VCO 116). In one embodiment, in the training phase of the second mode of operation, the output of the first phase detector 110 is connected, with an enabled connection, to the input of the controlled oscillator (e.g., VCO 116), and the first link data input (e.g., 136b) is connected, with an enabled connection, to the forwarded clock input (e.g., 110b).

To summarize, in one embodiment, the system includes: a data buffer 125 including an output and a differential input, the differential input including a first conductor and a second conductor; a forwarded clock buffer 105 including an output and a differential input, the differential input including a first conductor and a second conductor; wherein the control logic circuit 150 further is a circuit to select between the first mode of operation, the tracking phase of the second mode of operation, and a training phase of the second mode of operation wherein, in the training phase of the second mode of operation: the output of the first phase detector 110 is connected, with an enabled connection, to the input of the controlled oscillator (e.g., VCO 116); the first conductor of the differential input of the data buffer 125 is connected, with an enabled connection, to the first conductor of the differential input of the forwarded clock buffer 105; and the second conductor of the differential input of the data buffer 125 is connected, with an enabled connection, to the second conductor of the differential input of the forwarded clock buffer 105.

Referring to FIG. 3, in one embodiment, a display 300 includes a timing controller 310 and a driver integrated circuit (IC) 320, and the timing controller 310 is configured to send high-speed serial data on a data lane 330, with or without an accompanying forwarded clock on a clock lane 340, to the driver IC 320. A clock and data recovery circuit 350 constructed according to an embodiment of the present invention recovers the clock from the forwarded clock if one is present, or otherwise from the data. Here, in embodiments of the present invention, the display is an organic light emitting diode (OLED) display or a liquid crystal display (LCD).

Although exemplary embodiments of a bimodal serial link CDR architecture have been specifically described and illustrated herein, many modifications and variations will be apparent to those skilled in the art. Accordingly, it is to be understood that a bimodal serial link CDR architecture constructed according to principles of this invention may be embodied other than as specifically described herein. The invention is also defined in the following claims, and equivalents thereof.

What is claimed is:

1. A system for generating a local clock, the system comprising:
    a controlled oscillator having an input and an output;
    a first link data input;
    a forwarded clock input;
    a first phase detector having a first input, a second input, and an output; and
    a first phase recovery block having a clock input, a data input connected to the first link data input, and an output switch-connected to the input of the controlled oscillator,
    the first input of the first phase detector being connected to the output of the controlled oscillator,
    the second input of the first phase detector being connected to the forwarded clock input, and
    the output of the first phase detector being switch-connected to the controlled oscillator,
    the system further comprising a control logic circuit to select between a first mode of operation and a tracking phase of a second mode of operation, wherein
    in the first mode of operation, the output of the first phase detector is connected, with an enabled connection, to the input of the controlled oscillator, and
    in the tracking phase of the second mode of operation, the output of the first phase recovery block is connected, with an enabled connection, to the input of the controlled oscillator,
    wherein the control logic circuit further is a circuit to select between the first mode of operation, the tracking phase of the second mode of operation, and a training phase of the second mode of operation, wherein, in the training phase of the second mode of operation, the output of the first phase detector is connected, with an enabled connection, to the input of the controlled oscillator, and the first link data input is connected, with an enabled connection, to the forwarded clock input.

2. The system of claim 1, further comprising a transmitter, the transmitter comprising a circuit to, in the training phase of the second mode of operation, transmit a pattern of alternating groups of ones and zeros.

3. A system for generating a local clock, the system comprising:
a controlled oscillator having an input and an output;
a first link data input;
a forwarded clock input;
a first phase detector having a first input, a second input, and an output; and
a first phase recovery block having a clock input, a data input connected to the first link data input, and an output switch-connected to the input of the controlled oscillator,
the first input of the first phase detector being connected to the output of the controlled oscillator,
the second input of the first phase detector being connected to the forwarded clock input, and
the output of the first phase detector being switch-connected to the controlled oscillator,
the system further comprising a control logic circuit to select between a first mode of operation and a tracking phase of a second mode of operation, wherein
in the first mode of operation, the output of the first phase detector is connected, with an enabled connection, to the input of the controlled oscillator, and
in the tracking phase of the second mode of operation, the output of the first phase recovery block is connected, with an enabled connection, to the input of the controlled oscillator,
the system further comprising:
a data buffer comprising an output and a differential input, the differential input comprising a first conductor and a second conductor; and
a forwarded clock buffer comprising an output and a differential input, the differential input comprising a first conductor and a second conductor;
wherein the control logic circuit further is a circuit to select between the first mode of operation, the tracking phase of the second mode of operation, and a training phase of the second mode of operation,
wherein, in the training phase of the second mode of operation:
the output of the first phase detector is connected, with an enabled connection, to the input of the controlled oscillator,
the first conductor of the differential input of the data buffer is connected, with an enabled connection, to the first conductor of the differential input of the forwarded clock buffer, and
the second conductor of the differential input of the data buffer is connected, with an enabled connection, to the second conductor of the differential input of the forwarded clock buffer.

4. A display, comprising:
a timing controller;
a driver integrated circuit (IC); and
a serial data link connecting the timing controller and the driver IC,
the driver IC comprising a system for generating a local clock, the system comprising:
a controlled oscillator having an input and an output;
a first link data input;
a forwarded clock input;
a first phase detector having a first input, a second input, and an output; and
a first phase recovery block having a clock input, a data input connected to the first link data input, and an output switch-connected to the input of the controlled oscillator,
the first input of the first phase detector being connected to the output of the controlled oscillator,
the second input of the first phase detector being connected to the forwarded clock input, and
the output of the first phase detector being switch-connected to the controlled oscillator,
the system further comprising a first phase interpolator having:
an oscillator input;
a phase adjust input; and
an output;
the oscillator input of the first phase interpolator being connected to the output of the controlled oscillator and the output of the first phase interpolator being connected to the clock input of the first phase recovery block;
the system further comprising:
a second link data input;
a second phase recovery block having a clock input, a data input, and an output, the data input of the second phase recovery block being connected to the second link data input; and
a second phase interpolator having an oscillator input, a phase adjust input, and an output;
the output of the second phase recovery block being connected to the phase adjust input of the second phase interpolator,
the oscillator input of the second phase interpolator being connected to the output of the controlled oscillator, and
the output of the second phase interpolator being connected to the clock input of the second phase recovery block.

5. The display of claim 4, wherein the display is an organic light emitting diode (OLED) display or a liquid crystal display (LCD).

6. A system for generating a local clock, the system comprising:
a controlled oscillator having an input and an output;
a first link data input;
a forwarded clock input;
a first phase detector having a first input, a second input, and an output; and
a first phase recovery block having a clock input, a data input connected to the first link data input, and an output switch-connected to the input of the controlled oscillator,
the first input of the first phase detector being connected to the output of the controlled oscillator,
the second input of the first phase detector being connected to the forwarded clock input, and
the output of the first phase detector being switch-connected to the controlled oscillator,
the system further comprising a first phase interpolator having:
an oscillator input;
a phase adjust input; and
an output;
the oscillator input of the first phase interpolator being connected to the output of the controlled oscillator and the output of the first phase interpolator being connected to the clock input of the first phase recovery block;
the system further comprising:
a second link data input;
a second phase recovery block having a clock input, a data input, and an output, the data input of the second phase recovery block being connected to the second link data input; and a second phase interpolator having an oscillator input, a phase adjust input, and an output;

the output of the second phase recovery block being connected to the phase adjust input of the second phase interpolator, the oscillator input of the second phase interpolator being connected to the output of the controlled oscillator, and the output of the second phase interpolator being connected to the clock input of the second phase recovery block, the system further comprising a first phase interpolator having:

an oscillator input;

a phase adjust input; and an output;

the oscillator input of the first phase interpolator being connected to the output of the controlled oscillator and the output of the first phase interpolator being connected to the clock input of the first phase recovery block.

7. A system for generating a local clock, the system comprising:

a controlled oscillator having an input and an output;

a first link data input;

a forwarded clock input;

a first phase detector having a first input, a second input, and an output; and a first phase recovery block having a clock input, a data input connected to the first link data input, and an output switch-connected to the input of the controlled oscillator, the first input of the first phase detector being connected to the output of the controlled oscillator, the second input of the first phase detector being connected to the forwarded clock input, and the output of the first phase detector being switch-connected to the controlled oscillator, the system further comprising a divider having an input and an output, the input of the divider being connected to an output of the controlled oscillator and the output of the divider being connected to the first input of the first phase detector, the system further comprising a first phase interpolator having:

an oscillator input;

a phase adjust input; and an output;

the oscillator input of the first phase interpolator being connected to the output of the controlled oscillator and the output of the first phase interpolator being connected to the clock input of the first phase recovery block.

8. A system for generating a local clock, the system comprising:

a controlled oscillator having an input and an output a first link data input;

a forwarded clock input;

a first phase detector having a first input, a second input, and an output; and a first phase recovery block having a clock input, a data input connected to the first link data input, and an output switch-connected to the input of the controlled oscillator, the first input of the first phase detector being connected to the output of the controlled oscillator, the second input of the first phase detector being connected to the forwarded clock input, and the output of the first phase detector being switch-connected to the controlled oscillator, the system further comprising a control logic circuit to select between a first mode of operation and a tracking phase of a second mode of operation, wherein in the first mode of operation, the output of the first phase detector is connected, with an enabled connection, to the input of the controlled oscillator, and in the tracking phase of the second mode of operation, the output of the first phase recovery block is connected, with an enabled connection, to the input of the controlled oscillator, the system further comprising a first phase interpolator having:

an oscillator input;

a phase adjust input; and an output;

the oscillator input of the first phase interpolator being connected to the output of the controlled oscillator and the output of the first phase interpolator being connected to the clock input of the first phase recovery block.

* * * * *